(12) United States Patent
Caldwell et al.

(10) Patent No.: US 7,496,885 B1
(45) Date of Patent: Feb. 24, 2009

(54) METHOD OF COMPENSATING FOR DEFECTIVE PATTERN GENERATION DATA IN A VARIABLE SHAPED ELECTRON BEAM SYSTEM

(75) Inventors: Brian Neal Caldwell, Milton, VT (US); Daniel Boyd Sullivan, Edina, MN (US); Raymond Walter Jeffer, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/061,439

(22) Filed: Apr. 2, 2008

(51) Int. Cl.
*G06F 17/50* (2006.01)

(52) U.S. Cl. .................. 716/21; 716/5; 716/19

(58) Field of Classification Search ............ 716/19, 716/21, 5
See application file for complete search history.

(56) References Cited

U.S. PATENT DOCUMENTS

| 5,386,430 | A * | 1/1995 | Yamagishi et al. ............ 372/57 |
| 6,649,919 | B2 | 11/2003 | Chao et al. |
| 7,250,237 | B2 | 7/2007 | Ottens et al. |
| 7,254,251 | B2 | 8/2007 | Cai et al. |
| 2006/0183025 | A1 | 8/2006 | Yang et al. |
| 2006/0284120 | A1 | 12/2006 | Takita |

* cited by examiner

*Primary Examiner*—Sun J Lin
(74) *Attorney, Agent, or Firm*—PRTSI, Inc.; Martin D. Moynihan

(57) ABSTRACT

The present invention comprises a system, software, and method for the treatment of mask data that produces defects in resultant images produced in the fabrication of a mask, following identification of the defects. The invention involves identifying each exposure shot with certain information which when combined with similar information related to the defects is used to control the exposure tool to toggle or modulate the shots related to the defects and thus, eliminate the defects.

1 Claim, 4 Drawing Sheets

METHOD OF COMPENSATING FOR DEFECTIVE PATTERN GENERATION DATA IN A VARIABLE SHAPED ELECTRON BEAM SYSTEM

FIELD OF THE INVENTION

The invention is in the field of treatment of defective mask pattern generation data that produces defects in images when the mask is used in an exposure tool in a photolithographic system.

BACKGROUND

Chip design and subsequent mask pattern generation is a time consuming and costly operation. In an electron beam (e-beam) mask writing system using a shaped beam lithography system for a chip design involving a large number of dense circuits, it is not unusual for the number of shots to make up the complete pattern to be in the order of 1E10 shots or more.

A brief summary of what typically occurs in the design process is as follows. The chip designer produces design data for each mask level. The design data is checked for errors. Then optical proximity correction (OPC) and rules checking is performed on the data and the data modified accordingly. This data is sent to mask fabrication where the data is post-processed to provide pattern generation data for the exposure tool type to be used in the mask making process. Finally, using this data, a mask is created for each chip design layer.

In the above process, the OPC and other compensation techniques used take the original shape design data and modify the data, such as by adding dimensions to selected shapes in one or more areas, to compensate for effects such as those due to the lithographic process, the chip production process and pattern densities.

It is not uncommon for the mask patterns thusly generated to create one or more images that violate physical ground rules for the chip created from the mask. For that reason, following initial mask exposure, the exposure is inspected for such problems. Any defects found would then be identified and reported back to the chip designer. The chip designer would then attempt to correct the design data and the whole process would be repeated, causing a significant additional expense in time and effort.

SUMMARY

An embodiment of the present invention provides a system, software, and method for eliminating one or more defects from masks printed from an original mask data set, said original mask data set including shot data responsible for the one or more defects, when used on a photolithographic exposure tool. Starting with the original mask data set, shot identification information for each individual exposure shot, contained therein, is stored. The shot identification information comprises shot location information of each individual exposure shot and shot sequencing information of each individual exposure shot, and may also contain shot size and/or shot dosage information of one or more individual exposure shots. Then, either by inspecting an exposure, created, using the original mask data set, for the one or more defects or by simulating the exposure results from the design data, the one or more defects are identified. Defect shot identification information for the one or more defects resulting from the inspection or simulation is then stored. The defect shot identification information will comprises shot location information of each shot causing said one or more defects, shot sequencing information of each shot causing said one or more defects, and may also comprise shot dosage and/or size information of each shot causing said one or more defects. After defects are identified, error correction data is generated from the stored shot identification information and the stored defect shot identification information. Then the error correction data is merged with the original mask data set. This merged data is then used to control a set of one or more exposure shots, on the exposure tool, for each location of the one or more defects, on subsequently printed masks to eliminate the one or more defects on the subsequently printed masks. The control may comprise toggling the one or more exposure shots off, modulating the shot dose, shifting the placement of the entire shot, or to shift the placement of one or more edges of one or more shots which will modulate the shot size or shot edge.

DETAILED DESCRIPTION OF INVENTION

An embodiment of the present invention comprises a system, software, and method for the treatment of mask data that produces defects in resultant images produced in the fabrication of a mask, following an inspection of the mask for defects.

Figure 1:
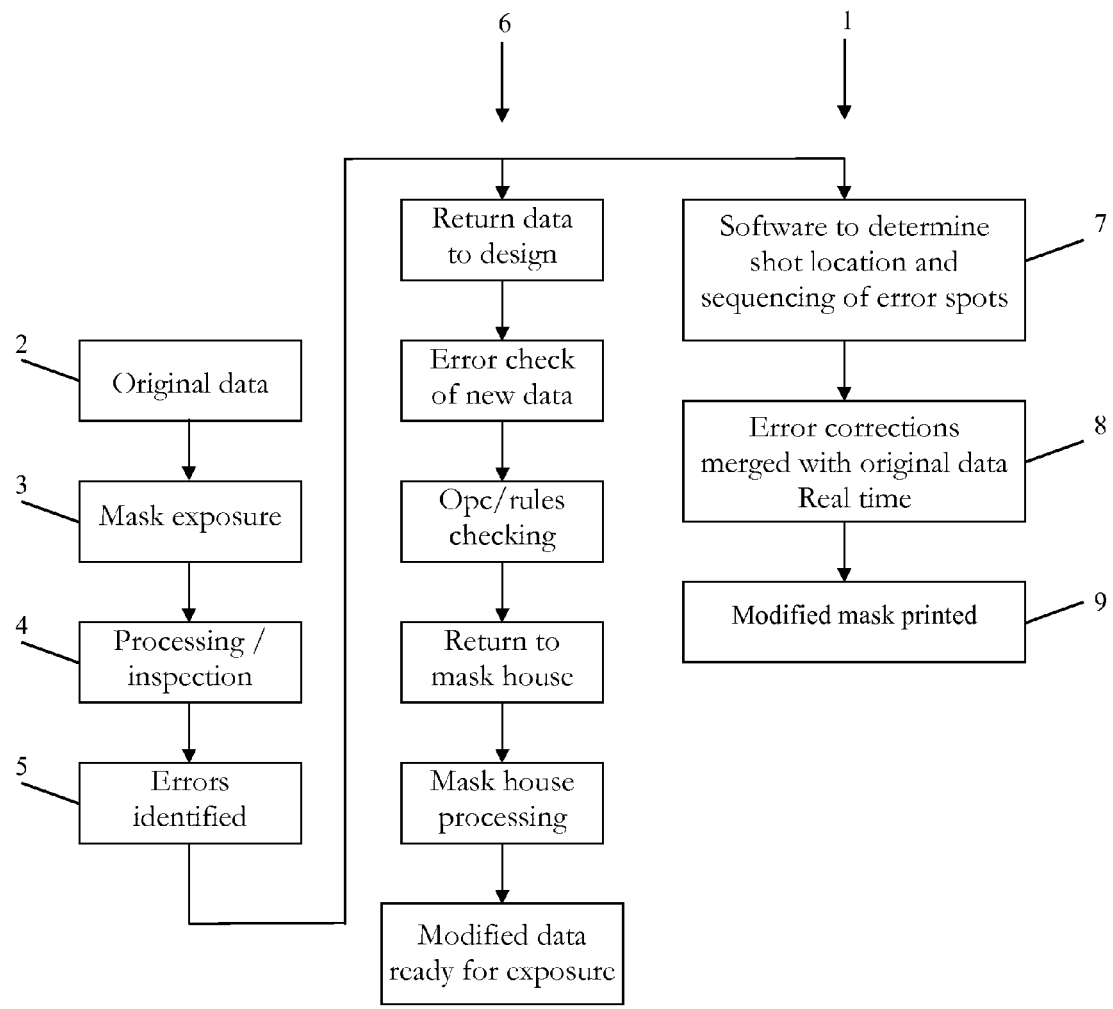
FIG. 1 shows a flow chart, which shows both the current method and an exemplary embodiment of the inventive method for handling defects found in mask data.

A flow chart of an exemplary embodiment of the present invention is presented in FIG. 1. The last column 1 of the flow chart represents the inventive changes from the conventional handling of mask defective data. The first step, common to both conventional and inventive methods, starts with the generation of the original mask data set 2. Using this original mask data set 2, the mask is exposed 3 and then is processed and inspected 4 for defects. An alternative to shooting and inspecting, the defects may be simulated, using the original mask data set 2. The defects are identified 5. At this point, the conventional method and system for treatment of the defective mask data may be applied as shown in the second column 6 of the flow chart and discussed in the background section above or the inventive system and method, shown in the third column 1 of the flow chart, as discussed in further detail below, may be applied.

In the third column 1 of the flow chart of FIG. 1, the step 7 of using software to determine the shot location, shot sequencing, and shot dosage of the error locations identified in 5 above is applied. A prerequisite of determining the shot location, shot sequencing, and shot dosage is to identify each and every shot taken as to its location and sequence and also, if desired, its dosage and size. Storage means is used to store this information. In step 8, this information, related to the shot location, shot sequencing, and shot dosage of the error locations is then merged with the original mask data set 2. In step 9 the merged data and defect information is used to print a modified mask, eliminating the defects identified in step 5. In order to eliminate the defects, when the mask is being printed, the exposure tool must be instructed to either toggle off at the defect locations, modulate the shot or shots applied at the defect locations, or selectively toggle and modulate at the defect locations. The modulation comprises the modulation of any one, or a combination of any two or more, of shot dosage, shot size or shot edge location. The merged data of step 8 provides these instructions to the exposure tool.

Figure 2:
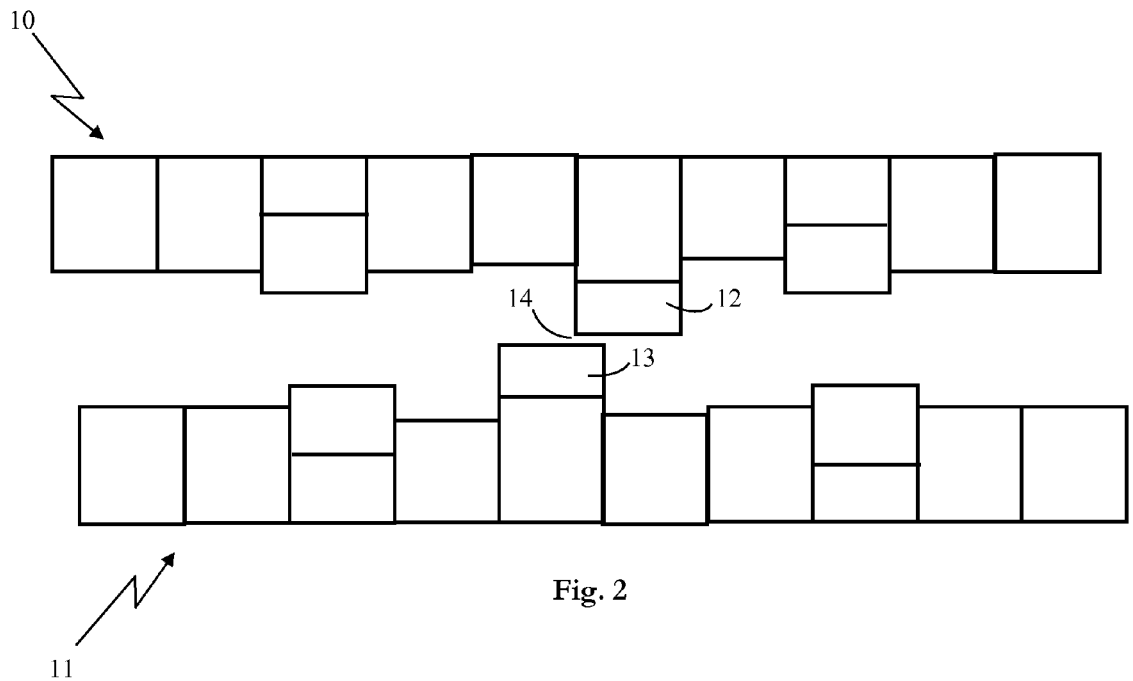
FIG. 2 shows pictorially represented, segmented mask data which, when applied to an exposure system produces unacceptable mask images.

FIG. 2 shows an example of pictorially represented, segmented, original mask pattern data 2 which would result in two shapes 10 and 11 being printed. Shots 12 and 13 using only the original data would cause a gap 14 between the two shapes 10 and 11 with said gap being in violation of the design rules.

Figure 3:
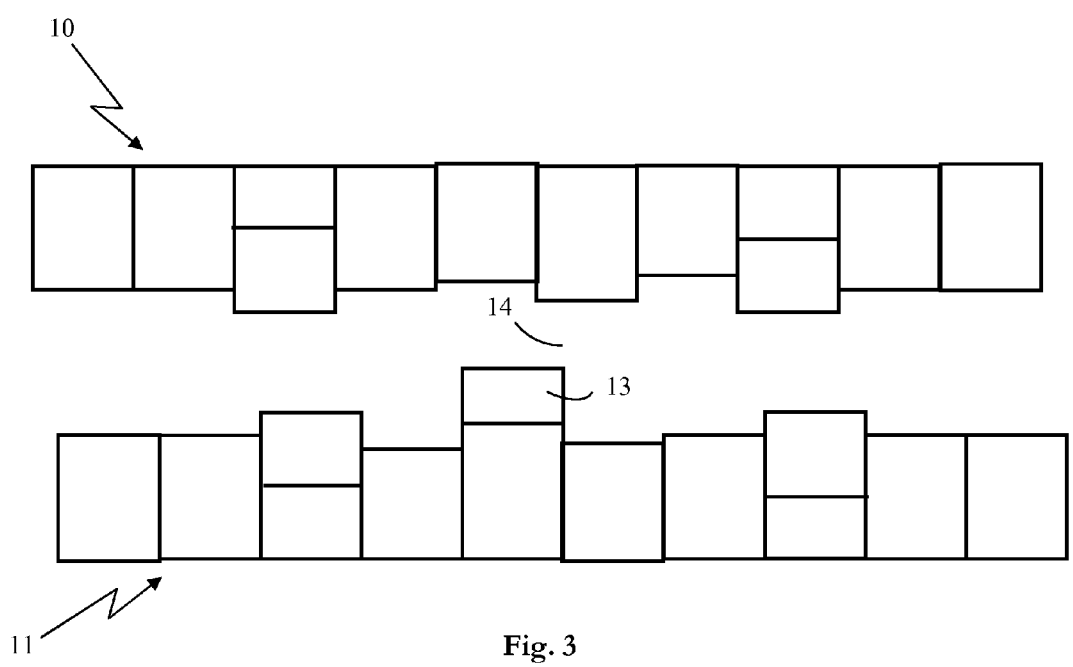
FIG. 3 shows pictorially represented, segmented mask data with a problem causing shot eliminated by toggling the exposure tool off for that shot.

FIG. 3 shows the resultant printed images 10 and 11 using the merged data 9 with the shot 12 of FIG. 2 toggled off. Thus, in FIG. 3, there is no shape 12 printed, resulting in an acceptable size for gap 14. Instead of shot 12, shot 13 could be toggled off for similar results of an acceptable size gap 14. Also, shots 12 and 13 both could be toggled off.

Figure 4:
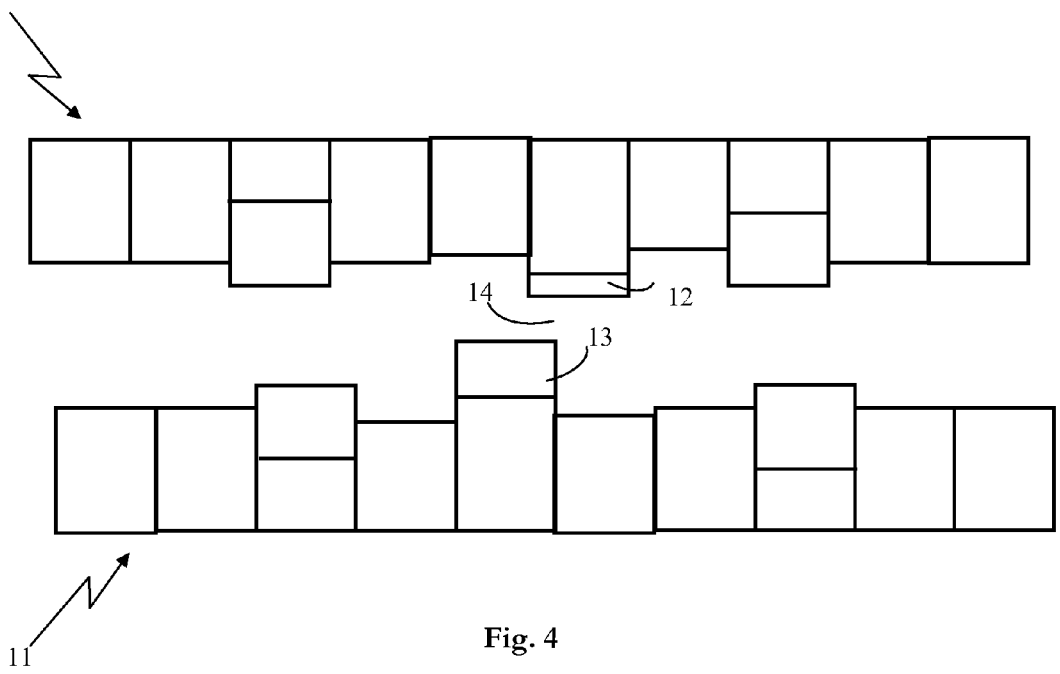
FIG. 4 shows pictorially represented, segmented mask data with a problem causing shot eliminated by modulating the shot size.

In FIG. 4, instead of toggling shot 12 off, using merged data 9, the size of shot 12 is varied such that the size of gap 14 is acceptable. The modulation of the size of shot 12 could also be applied to shot 13 or can be applied to shot 13 instead of shot 12 to achieve an acceptable size gap 14.

Figure 5:
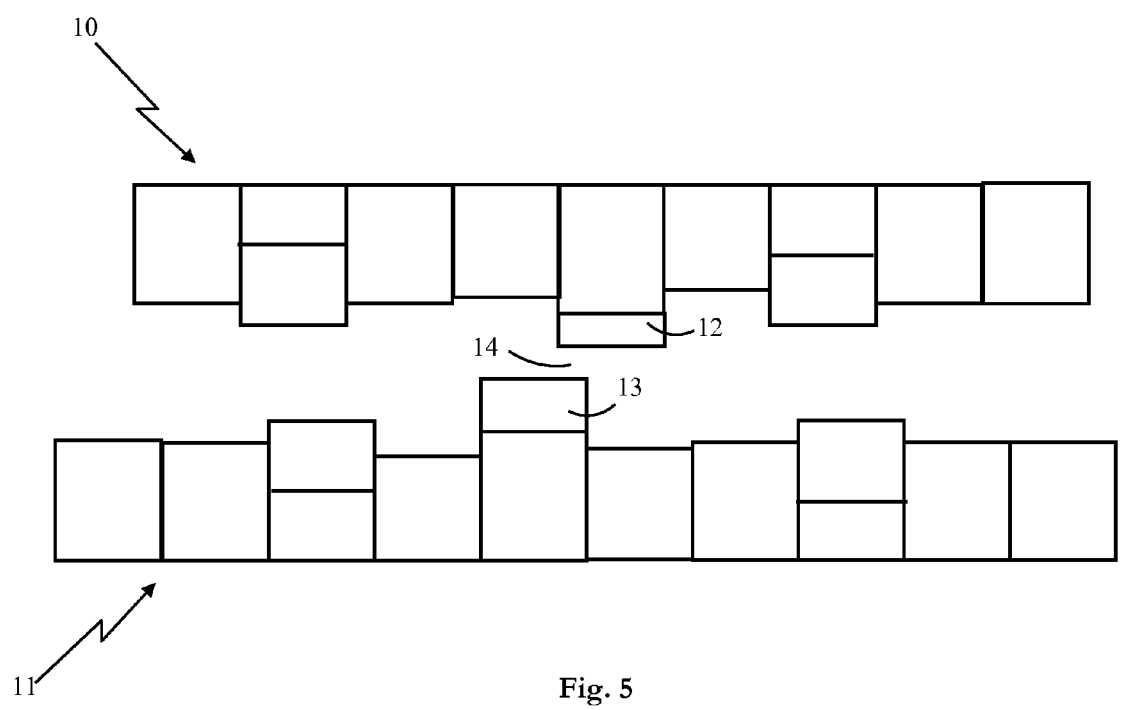
FIG. 5 shows pictorially represented, segmented mask data with a problem causing shape eliminated by modulating the shape size.

In FIG. 5, shot 12, using merged data, has its dosage modulated to achieve an acceptable size gap 14. Again, shot 13, instead of, or along with, shot 12 could have its dosage modulated to achieve an acceptable size of gap 14.

Figure 6:
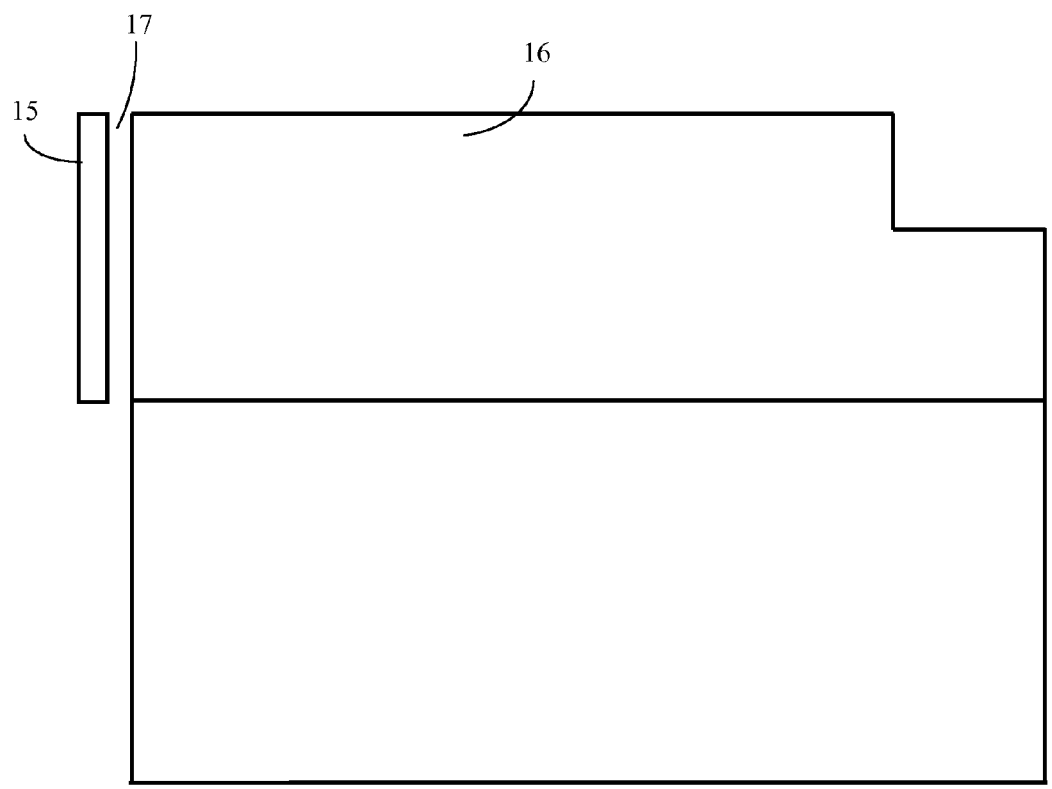
FIG. 6 shows a segmented shape with an additional shot at its edge.
Figure 7:
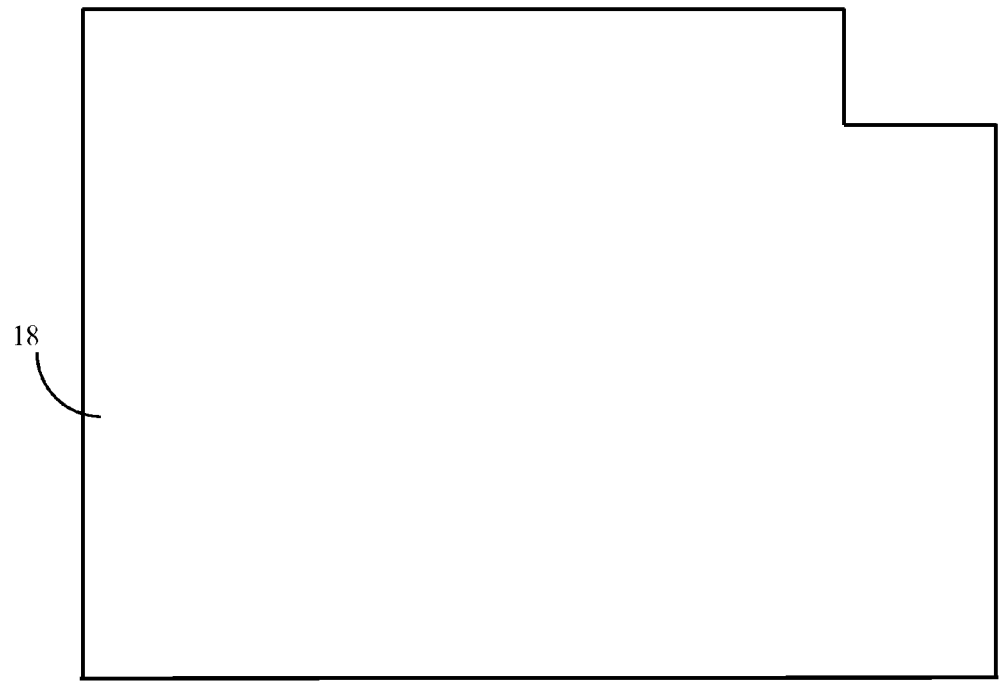
FIG. 7 shows the shape of FIG. 6 with the additional shot toggled off.

In FIG. 6, the edge of a shape 16 with an adjacent, additional shape 15 leaving a gap 17 there between. FIG. 7 shows the resultant shape 18 printed from the merged data 9 in which the exposure shot 15 was toggled off.

While the invention is preferably applied to a photolithographic system using an e-beam exposure tool, it is not limited to such a system, but may be applied to photolithographic systems using other exposure methods.

Also, the individual steps described above for eliminating the one or more defects, printed from the original data set, are not necessarily performed in the sequence described. For example, the one or more defects might be identified before the location of each shot is identified.

The invention claimed is:

1. A method for correcting mask pattern generation data resulting in one or more defects in mask shapes printed from an original mask pattern generation data set wherein said original mask pattern generation data set comprising multiple complex segmented and merged data, said original mask pattern generation data set further including shot data responsible for the one or more defects, when shot on an exposure tool, said method comprising:

storing, from the original mask data set, shot identification information of each individual exposure shot, wherein said shot identification information further comprising information selected from a group consisting of shot location information, shot sequencing identification, shot dosage information, and shot size information;

identifying and storing defect shot identification information for the one or more defects, wherein said defect shot identification information further comprising information selected from a group consisting of shot location information, shot sequencing identification, shot dosage information, and shot size information;

generating error correction data from the stored shot identification information and the stored defect shot identification information;

merging the error correction data with the original mask pattern generation data set; and controlling a set of one or more exposure shots, on the exposure tool, for each location of the one or more defects, using the merged error correction data with the original mask pattern generation data set to print subsequent masks, such that the one or more defects from masks printed from the original mask pattern generation data set are eliminated from the subsequent masks.

* * * * *